United States Patent
Hsu et al.

(10) Patent No.: US 8,304,354 B2
(45) Date of Patent: Nov. 6, 2012

(54) METHODS TO AVOID LASER ANNEAL BOUNDARY EFFECT WITHIN BSI CMOS IMAGE SENSOR ARRAY

(75) Inventors: Kai-Chun Hsu, Yonghe (TW); Yeur-Luen Tu, Taichung (TW); Chung Chien Wang, Shanhua Township, Tainan County (TW); Tzu-Hsuan Hsu, Kaohsiung (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 162 days.

(21) Appl. No.: 12/765,496

(22) Filed: Apr. 22, 2010

(65) Prior Publication Data

US 2011/0263069 A1    Oct. 27, 2011

(51) Int. Cl.
   *H01L 21/31*    (2006.01)
(52) U.S. Cl. ..................................... 438/795; 219/121.8
(58) Field of Classification Search ................... 438/795, 438/796; 219/121.78, 121.79, 121.8
See application file for complete search history.

(56) References Cited

U.S. PATENT DOCUMENTS

2009/0200587 A1* 8/2009 Venezia et al. ............... 257/292

* cited by examiner

*Primary Examiner* — Charles Garber
*Assistant Examiner* — Reema Patel
(74) *Attorney, Agent, or Firm* — Haynes and Boone, LLP (57) ABSTRACT

Methods are disclosed herein for determining the laser beam size and the scan pattern of laser annealing when fabricating backside illumination (BSI) CMOS image sensors to keep dark-mode stripe patterns corresponding to laser scan boundary effects from occurring within the sensor array regions of the image sensors. Each CMOS image sensor has a sensor array region and a periphery circuit. The methods determines a size of the laser beam from a length of the sensor array region and a length of the periphery circuit so that the laser beam covers an integer number of the sensor array region for at least one alignment of the laser beam on the array of BSI image sensors. The methods further determines a scan pattern so that the boundary of the laser beam does not overlap the sensor array regions during the laser annealing, but only overlaps the periphery circuits.

20 Claims, 8 Drawing Sheets

METHODS TO AVOID LASER ANNEAL BOUNDARY EFFECT WITHIN BSI CMOS IMAGE SENSOR ARRAY

TECHNICAL FIELD

The present disclosure relates generally to methods for fabricating image sensors. Specifically, the present disclosure relates to methods for fabricating backside illumination (BSI) CMOS image sensor arrays.

BACKGROUND

An image sensor consists of an array of light sensitive picture elements (pixels) arranged in a sensor array region and periphery circuit elements. The pixels of the sensor array region respond to light incident on the pixels from a subject scene by generating electrical charges. The periphery circuit elements receive and process the generated electrical charges to display an image of the subject scene.

Image sensors may be fabricated on a semiconductor substrate using complementary metal-oxide-semiconductor (CMOS) circuits and fabrication techniques. In CMOS image sensors, each pixel consists of a photodiode formed on a semiconductor substrate and additional layers formed on the photodiode. These additional layers include one or more dielectric layers and metal layers to provide interconnects between the pixels and the periphery circuit elements. The side of the image sensor on which these additional layers are formed is referred to as the front side, while the side having the semiconductor substrate is referred to as the backside. In front-side illuminated (FSI) image sensors, light from the subject scene is incident on the front-side of the image sensors. However, the presence of the dielectric and metal layers on the front-side may limit the amount of light absorbed by the photodiodes, resulting in decreased sensitivity and degraded performance. In backside illuminated (BSI) image sensors, light is incident on the backside to allow a more direct path for the photons to reach the photodiodes. Thus, BSI CMOS image sensors avoid the obstruction to the optical path by the front-side layers so as to increase the number of photons reaching the photodiodes.

To improve light sensitivity of BSI CMOS image sensors, the semiconductor substrate is typically thinned. Furthermore, a thin layer of $P^+$ ions may be implanted on the backside of the thinned semiconductor substrate to increase the number of photons converted into electrical charges. Once the thin $P^+$ layer 122 is formed, a laser annealing step is performed to repair crystal defects caused by the ion implantation step and to activate the implanted $P^+$ ions. Laser annealing is typically performed by scanning a laser beam in a scan pattern on a wafer containing an array of BSI image sensors. Uniformity of laser annealing is dependent on the uniformity of energy projected on the wafer from the scanning laser beam. However, laser beams typically do not have a uniform distribution of energy across the beam width. For example, energy density of a laser beam is usually reduced near the beam boundary. As a result, a sensor array region may not be uniformly annealed if it overlaps with a boundary of the laser scan pattern. This boundary effect may introduce dark current, which is current generated in the sensor array region even in the complete absence of incident light. Dark current causes horizontal and/or vertical stripe patterns in the image. It also adversely affects image sensor performance by making it more difficult for the sensor array region to detect light. Accordingly, there is a need to control the laser beam size and the scan pattern of laser annealing to keep the boundary effect from occurring within the sensor array region of an image sensor.

BRIEF SUMMARY

In accordance with one or more embodiments of the present disclosure, a method of laser annealing a wafer having a plurality of dies with a laser beam is disclosed. The die consists of a first sub-area which may not overlap with the boundary of the laser beam, and a second sub-area which may overlap with the boundary of the laser beam. The method includes receiving a length of the first sub-area, receiving a length of the second sub-area, and receiving a desired overlap between adjacent scan paths of a laser scan pattern. The method determines the size of the laser beam from the length of the first sub-area, the length of the second sub-area, and the desired overlap so that the size of the laser beam is large enough to cover an integer number of the first sub-area without partially covering an additional first sub-area. The method further determines the laser scan pattern so that the boundary of the laser beam does not overlap the first sub-area throughout the scan pattern.

In accordance with one or more embodiments of the present disclosure, a method of laser annealing an array of backside illuminated (BSI) image sensors with a laser beam is disclosed. Each of the image sensors consists of a sensor array region and a periphery circuit. The laser beam scans the image sensors using a scan pattern that consists of a number of scan paths. The method includes determining the size of the laser beam from the length of the sensor array region and the length of the periphery circuit so that the laser beam covers an integer number of the sensor array region for at least one alignment of the laser beam on the array of BSI image sensors. The method also includes aligning the laser beam on the array of BSI image sensors so that the boundary of the laser beam does not overlap any sensor array region. The method further includes laser annealing the array of BSI image sensors following a first scan path and then shifting the laser beam by an integer number of the length of a BSI image sensor. This scanning and shifting is repeated for all the scan paths until the array of BSI image sensors is laser annealed.

In accordance with one or more embodiments of the present disclosure, a method of laser annealing an array of backside illuminated (BSI) image sensors is disclosed. Each of the BSI image sensors consists of a sensor array region and a periphery circuit. The laser beam scans the BSI image sensors in a scan pattern that consists of a number of laser shots. The method includes determining an area of the laser shot from an area of the sensor array region and an area of the periphery circuit so that the laser shot covers an integer number of the sensor array region for at least one alignment of the laser beam on the array of BSI image sensors. The method also includes aligning the laser beam on the array of BSI image sensors in a first laser shot so that the boundary of the laser shot does not overlap any sensor array region. The method further includes laser annealing the array of BSI image sensors by successively shifting the laser beam in a width or a length direction by an integer number of a width or a length, respectively, of a BSI image sensor in subsequent laser shots until the array of BSI image sensors is laser annealed.

These and other embodiments of the present disclosure will be more fully understood by reference to the following detailed description when considered in conjunction with the following drawings.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

The present disclosure relates to methods for fabricating backside illumination (BSI) CMOS image sensor arrays to avoid dark-mode stripe pattern corresponding to laser scan boundary effects on the image sensor arrays during laser annealing. It is understood that the present disclosure provides many different foams and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," "connected to," or "coupled to" another element or layer, it may be directly on, connected to, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

Figure 1:
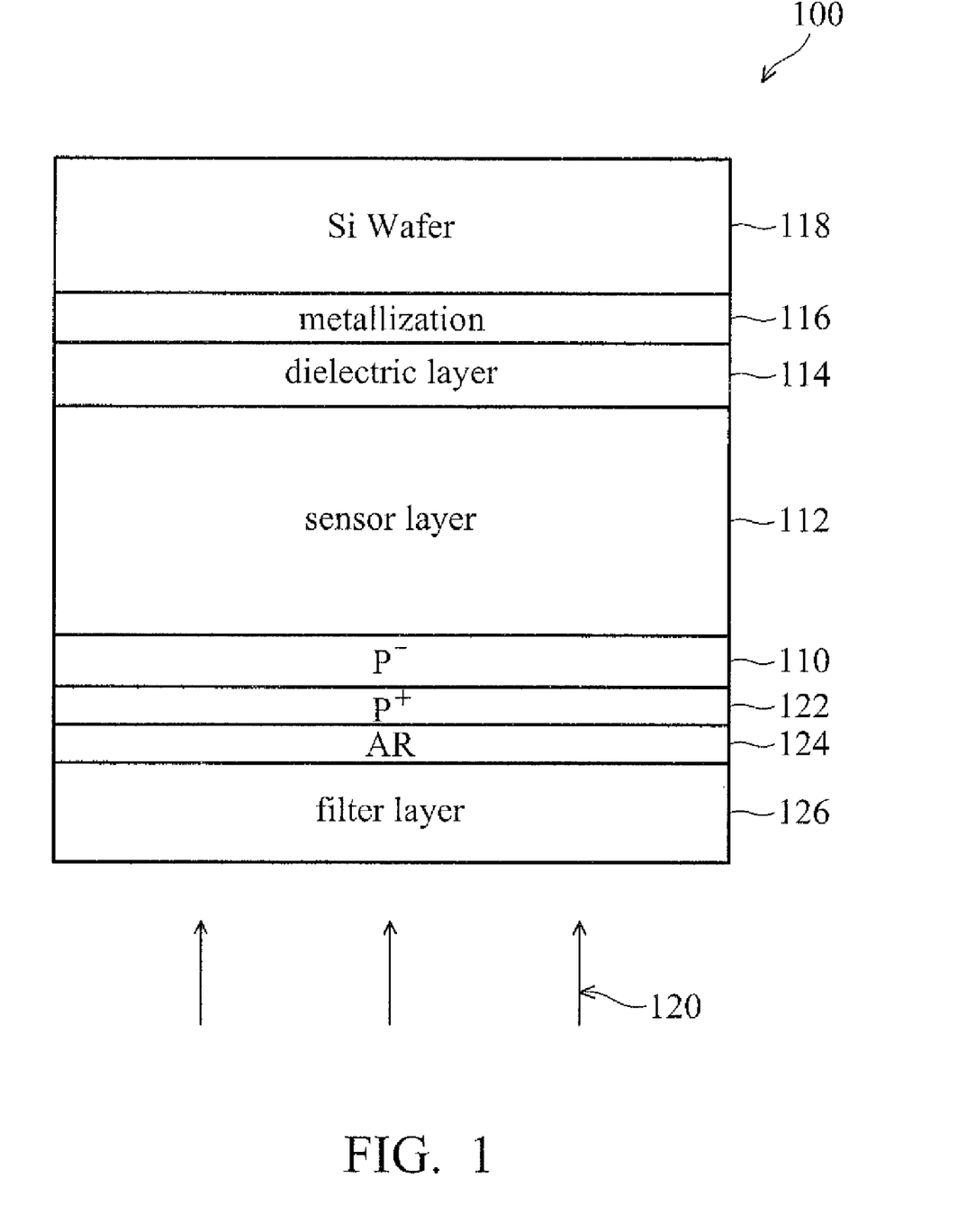
FIG. 1 shows a cross-sectional view of a pixel 100 of a BSI image sensor constructed according to one or more embodiments of the present disclosure.

FIG. 1 shows a cross-sectional view of a pixel 100 of a BSI image sensor constructed according to one or more embodiments of the present disclosure. The BSI image sensor may consist of an array of pixels in a sensor array region and also a periphery circuit adjacent to the sensor array for supporting and interfacing with the pixels of the sensor array. The pixels of the BSI image sensor respond to photons from light incident on the backside of the sensor array by generating electric charges. The charges are detected by the periphery circuit and may be used to drive displays in applications such as digital cameras.

The fabrication of the pixel 100 starts with a silicon substrate. The silicon substrate is lightly doped with P-type impurities using a process such as ion implantation or diffusion to form a P$^-$ silicon substrate 110. Alternatively, the substrate may consist of germanium, other elementary semiconductors, or compound semiconductors such as silicon carbide, gallium arsenide, indium arsenide, or indium phosphide. In one or more embodiments, substrates such as silicon-on-insulator or alloy semiconductor may also be provided. Additional layers and circuitries are formed on the P$^-$ silicon substrate 110 to fabricate the pixels and their interconnections to the periphery circuit. The side of the image sensor on which these additional layers are formed is referred to as the front-side, while the side opposite the front-side is called the backside.

For example, a sensor layer 112 is formed on the front side of the P$^-$ silicon substrate 110. The sensor layer 112 contains the image sensors for sensing photons from incident light. The image sensors may be CMOS image sensors (CIS), charge-coupled devices (CCD), or other types of sensors. The sensor layer 112 may be an N-type depletion region formed by doping the P$^-$ silicon substrate 110 with N-type impurities using a process such as ion implantation or diffusion.

The pixel 100 contains additional layers that are deposited and patterned on the sensor layer 112 such as a dielectric layer 114, one or more metallization layers 116, and other inter-metallization dielectric layers. The metallization layers 116 connect the sensors in the sensor layer 112 to the periphery circuit for the periphery circuit to control the sensors and to detect the electrical charges generated by the sensors. The metallization layer 116 may consist of aluminum, copper, tungsten, other metals, or combination thereof. The front side of the metallization layers 116 or dielectric layer 114 is bonded to a silicon wafer 118. The silicon wafer 118 may be a carrier wafer or a handle wafer that is used to provide support to the pixel 100 for subsequent handling and thinning of the P$^-$ silicon substrate 110.

Because the sensor layer 112 of pixel 100 senses incident light 120 from the backside surface of the P$^-$ silicon substrate 110, the P$^-$ silicon substrate 110 has to be thin enough such that photons from the incident light 120 can reach the sensor layer 112. The amount of light absorbed by the sensor layer 112 is characterized as the fill factor. One advantage of a BSI image sensor over a FSI (front-side illumination) image sensor is the BSI image sensor's increased sensitivity due to its higher fill factor. This is because light has a more direct path to the sensor layer 112 through the backside of a BSI image sensor by avoiding obstructions to the optical path from the metallization layers 116 and the dielectric layer 114 on the front side. However, to maintain the higher fill factor, the P$^-$ silicon substrate 110 needs to be thinned considerably from the typical thickness of a wafer substrate. For example, the P$^-$ silicon substrate 110 has a typical thickness of 745 um before thinning. After thinning, the thickness of the P$^-$ silicon substrate 110 may be 1~4 um. Thinning of the P$^-$ silicon substrate 110 may be performed by flipping over the pixel 100 and grinding, polishing, and/or chemically etching the backside of the P$^-$ silicon substrate 110 to reduce its width down to a desired thickness. During the thinning process, the silicon wafer 118 provides support to the pixel 100.

When incident light 120 strikes the backside of the P$^-$ silicon substrate 110, some current is generated near the backside surface of the P$^-$ silicon substrate. The electrons from the surface current may be absorbed by the P$^-$ silicon substrate 110 and thus prevented from reaching the sensor layer 112. This leads to poor quantum efficiency (QE), which is a measure of the percentage of photons that is converted into electrical charge. Therefore, to increase QE, a thin P$^+$ layer 122 is deposited on the backside of the P$^-$ silicon substrate 110. The thin P$^+$ layer 122 creates a potential difference between the P$^+$ layer 122 and the P$^-$ silicon substrate 110 to increase the number of electrons that may reach the sensor layer 112 without being absorbed by the P$^-$ silicon substrate 110. The thin P$^+$ layer 122 may be formed through an implantation of boron ions onto the backside of the P$^-$ silicon substrate 110. The typical thickness of the P$^+$ layer 122 is about 100 A to 1 um.

Once the thin P$^+$ layer 122 is formed, a laser annealing step is performed to repair crystal defects caused by the ion implantation step and to activate the implanted P$^+$ ions. Laser annealing is preferred over conventional annealing techniques because a high temperature required of conventional annealing techniques may damage the pixel structure. In particular, the high temperature may cause the metallization layers 116 to melt. In contrast, laser annealing only requires a high temperature near the backside surface of the P$^+$ layer 122, away from the front side. In addition, in laser annealing the annealing only extends down to a relatively shallow depth of 1 um from the backside surface, thus avoiding any damage to the front side metallization layer 116. After laser annealing, an anti-reflective layer 124 and an optional color filter 126 are placed on the backside of the pixel. The color filter 126 is provided for color image sensors in which the sensor layer 112 may respond to light of different wavelengths.

Figure 2:
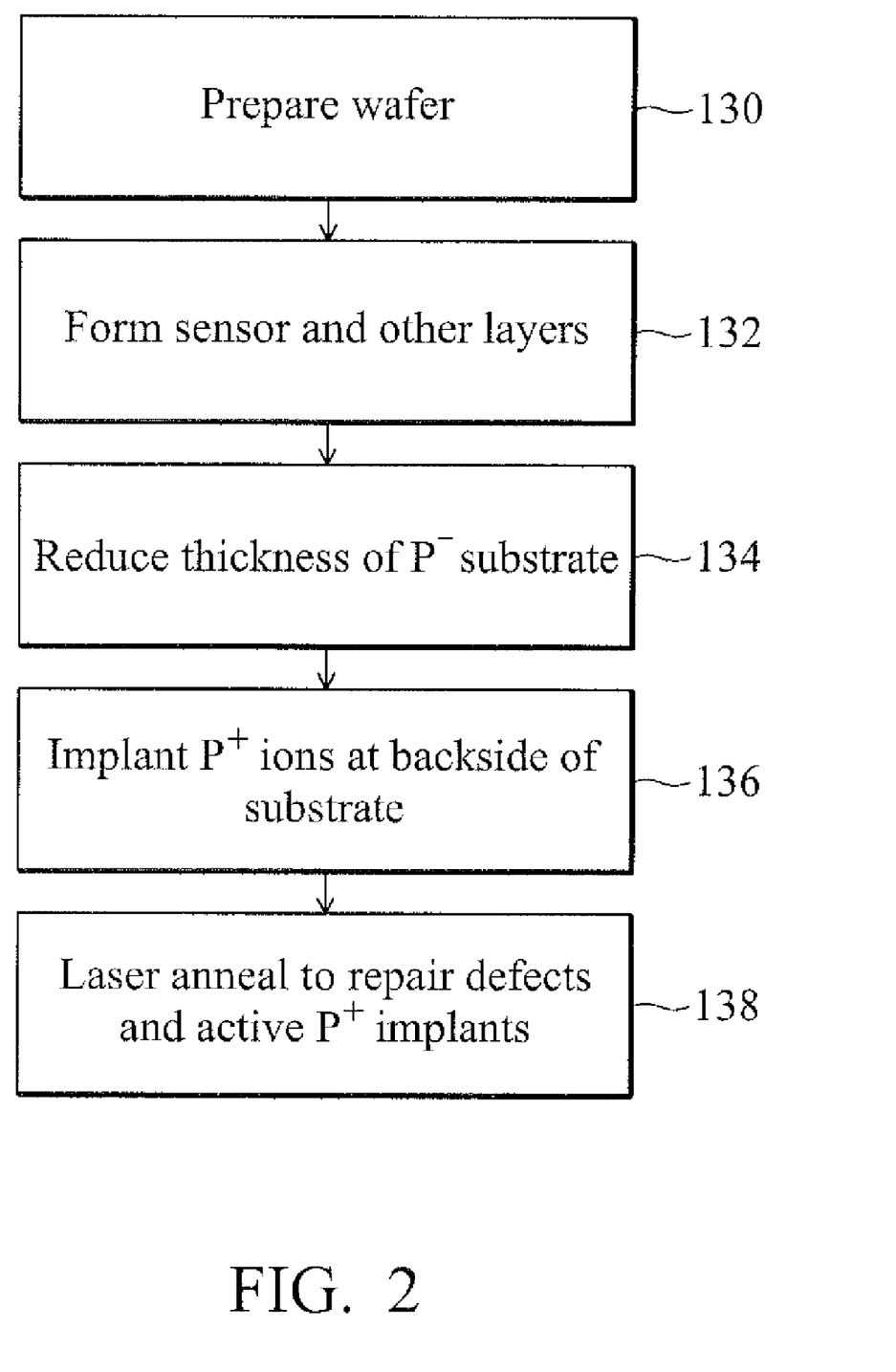
FIG. 2 shows a flowchart of a process for fabricating a pixel of a BSI image sensor according to one or more embodiments of the present disclosure.

FIG. 2 shows a flowchart of a process for fabricating a pixel of a BSI image sensor according to one or more embodiments of the present disclosure. The process starts in step 130 by preparing a wafer consisting of a P$^-$ substrate of silicon, other elementary semiconductors, compound semiconductors, silicon-on-insulator, or ally-semiconductors. This initial step of preparing the wafer is common for both BSI and FSI image sensors. In step 132, an N-type sensor layer, one or more dielectric layers, and one or more metallization layers are formed on the P$^-$ substrate. Additionally, a silicon wafer is bonded to the front side of the pixel to provide support to the pixel for subsequent handling and thinning of the P$^-$ substrate. In step 134, the pixel is flipped over and the P$^-$ substrate is thinned to a thickness of 1~4 um through grinding, polishing, and/or chemical etching. The thinned P$^-$ substrate allows more photons to reach the sensor layer from the backside, increasing the fill factor. To improve QE, step 136 implants P-type ions to create a thin P$^+$ layer having a thickness of about 100 A to 1 um on the backside of the P$^-$ substrate. The thin P$^+$ layer creates a potential difference between the P$^+$ layer and the P$^-$ substrate. The potential difference allows more electrons generated at the backside surface of the P$^-$ substrate to reach the N-type sensor layer without being absorbed by the P$^-$ silicon substrate. Finally, in step 138, a laser annealing process is performed to repair crystal defects caused by the ion implantation step of step 136 and to activate the implanted P$^+$ ions.

Laser annealing of a wafer may employ either a line scan or a step scan pattern. For the line scan pattern, the laser beam may scan across the wafer in a horizontal direction starting from the bottom of the wafer, shift up in a longitudinal direction when the laser beam reaches the end of the horizontal scan, scan across the wafer in the reverse horizontal direction, shift up in the longitudinal direction, and repeat the pattern until the entire surface of the wafer is scanned. For the step scan pattern, the laser beam is in the form of a laser shot having a coverage area bound in both the longitudinal and the horizontal direction. The laser shot may step scan in the horizontal direction across the wafer starting from the bottom of the wafer, step up in the longitudinal direction, step scan across the wafer in the reverse horizontal direction, step up in the longitudinal direction, and repeat the pattern until the entire surface of the wafer is scanned.

Figure 3:
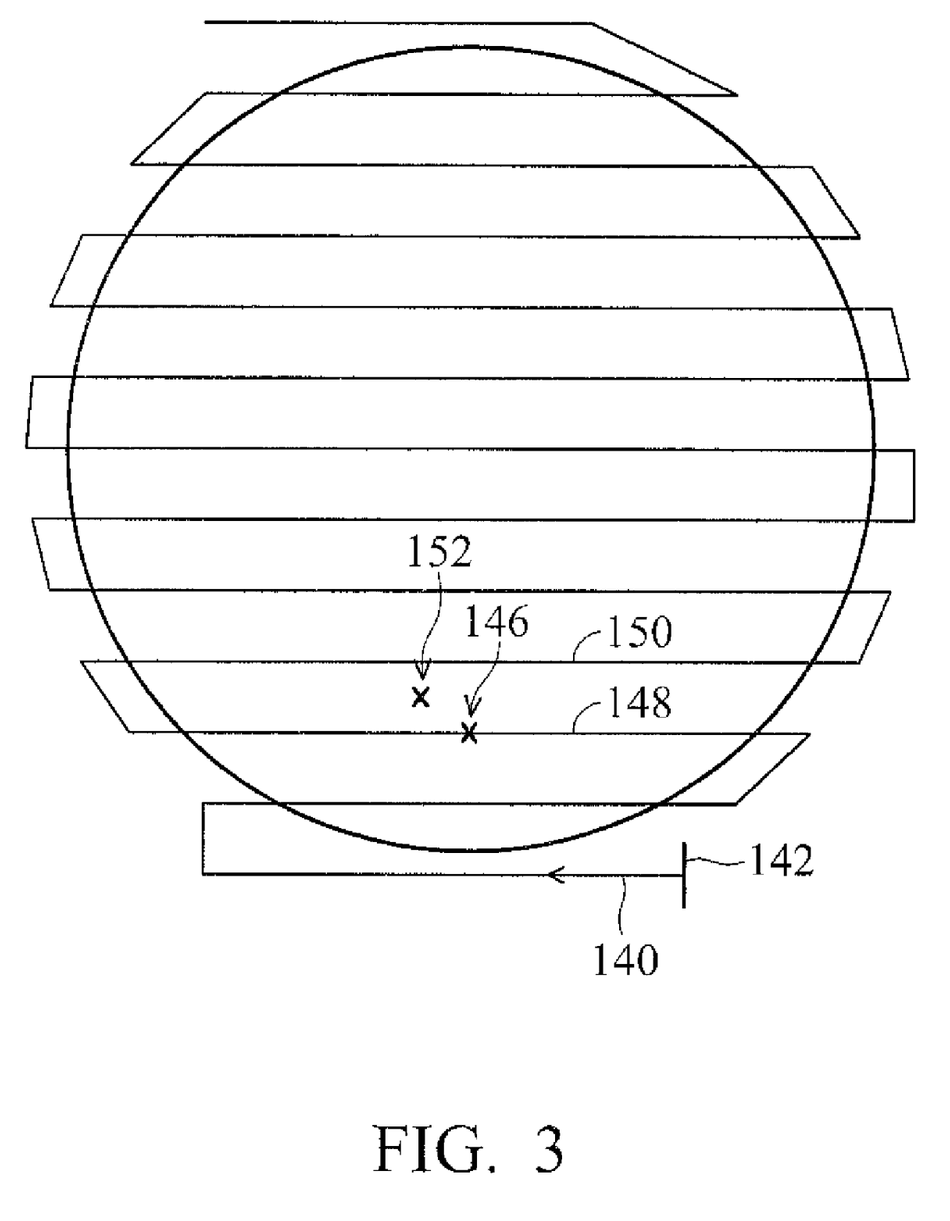
FIG. 3 shows a line scan pattern of a laser used to anneal a wafer according to one or more embodiments of the present disclosure.

FIG. 3 shows a line scan pattern of a laser used to anneal a wafer according to one or more embodiments of the present disclosure. The laser beam has a beam width 142. A typical beam width is 27 mm. The line scan path 140 represents the center of the beam width 142 as the laser scans the wafer. The beam widths between adjacent horizontal lines of the line scan path 140 overlap. Overlaps between adjacent lines ensure a uniform annealing of wafer crystal and also a uniform activation of the implanted P$^+$ ions. In one embodiment, the amount of overlap between beam widths of adjacent lines may be 50% of the beam width 142 so that the laser beam may scan any given surface area of the wafer twice. Similarly, for a step scan pattern, adjacent laser shots may overlap to a few microns.

The uniformity of wafer crystal annealing and ion activation is dependent on the uniformity of energy projected on the wafer from the laser scan. The energy projected on a given area is a sum of the projected laser beam energy on the area from the two scans. However, due to non-uniform distribution of energy within the width 142 of the laser beam in a line scan or within the laser shot in a step scan, the combined energy from the two scans may not be uniformity distributed across all wafer areas. For example, laser beam energy may be weaker near an outer boundary of the laser beam width 142 in line scan. Therefore, areas of the wafer scanned by a boundary of the laser beam width 142 from a first scan and by a center of the laser beam width 142 from a second scan may receive less combined energy than areas scanned by the center of the laser beam width 142 from both scans. As an example, a first area 146 on the wafer receives combined projected energy from the center of the laser beam width 142 for a first scan line 148 and from the boundary of the laser beam width 142 for a second scan line 150. On the other hand, a second area 152 on the wafer receives combined projected energy from a location within the laser beam that is offset by ¼ of the beam width 142 from the center of the laser beam for both the first and second scan lines 148 and 150. Because the distribution of energy may be uniform from the center of the beam width 142 to a distance ¼ of the beam width away from the center, but may have weaker energy at the boundary, first area 146 may receive less combined energy than second area 152. Similarly, in step scan the distribution of energy within a laser shot may be weaker near the boundary relative to the rest of the laser shot. Therefore, areas of the wafer step scanned by a boundary of the laser shot may receive less energy than other areas.

Figure 4:
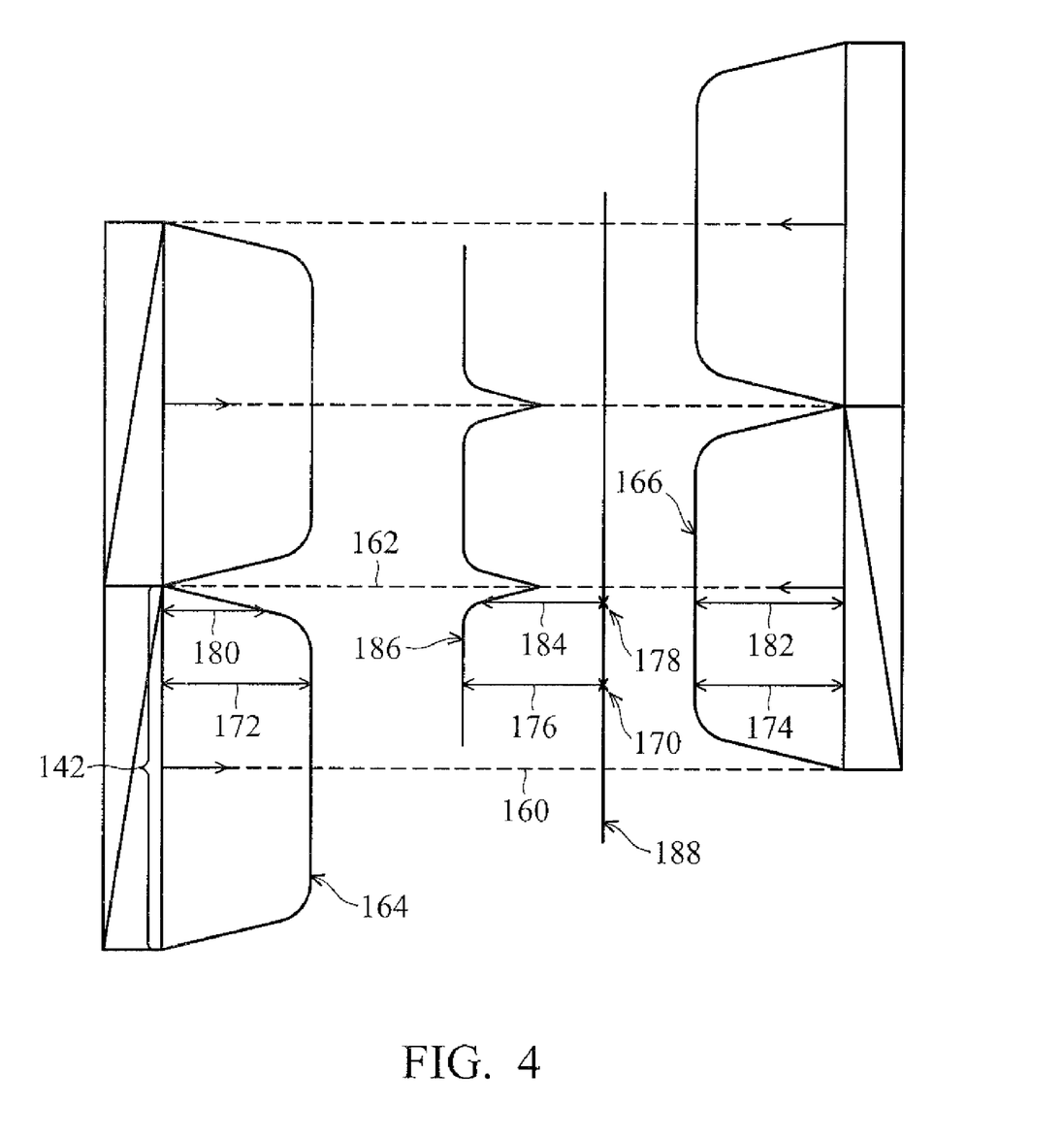
FIG. 4 illustrates the distribution of projected laser energy on a wafer from a line scan pattern with a 50% overlap between beam widths of adjacent scan lines according to one or more embodiments of the present disclosure.

FIG. 4 illustrates the distribution of projected laser energy on a wafer from a line scan pattern with a 50% overlap between beam widths of adjacent scan lines according to one or more embodiments of the present disclosure. Again, the laser beam has a laser beam width 142. The laser beam scans horizontally from left to right along scan line 160, shifts up by 50% of the laser beam width 142 when it reaches the right edge of scan line 160, scans horizontally from right to left along scan line 162, shifts up by another 50% of the laser beam width 142 when it reaches the left edge of scan line 162, and so forth until the entire wafer is scanned. Graph 164 represents the distribution of projected laser energy within the laser beam width 142 for scan line 160. Similarly, graph 166 represents the distribution of projected laser energy within the laser beam width 142 for scan line 162. The projected laser energy is fairly evenly distributed across most of the length of the laser beam width 142. However, near the line scan boundary, the projected laser energy becomes weaker.

Since areas on the wafer are scanned twice by the two adjacent scan lines, the total projected laser energy on an area is the combined projected energy from the two scan lines. For example, point 170 and all points on a horizontal line containing point 170 receives projected energy 172 from scan line 160 and projected energy 174 from scan line 162. The total projected energy for point 170 is then the sum of energy 172 and 174, and is represented by energy 176. Similarly, point 178 and all points on a horizontal line containing point 178 receives projected energy 180 from scan line 160 and projected energy 182 from scan line 162. Because point 178 is scanned by the boundary of laser beam width 142 from scan line 160, the projected energy 180 for point 178 is less than the projected energy 172 for point 170. Therefore, the total projected energy, as represented by energy 184, for point 178 from the sum of energy 180 and 182 is less than the energy 176 for point 170. Graph 186 thus represents the total projected energy for points located along the longitudinal axis 188 on the wafer. Graph 186 also represents the total projected energy for all points located along horizontal lines intersecting the longitudinal axis 188. Therefore, because of the non-uniform distribution of projected laser energy 164 within the laser beam width 142, the distribution of the total projected energy 186 on the wafer is also not uniform. In particular, points located near a boundary of the beam width 142 of the scan pattern receive less energy than points in other areas.

If the areas receiving reduced projected energy occur within a sensor array region of the image sensor, dark current, which is current generated in the sensor array even in the complete absence of incident light, may result. Dark current causes horizontal and/or vertical stripe patterns in the image corresponding to areas of the sensor array region receiving reduced energy from the laser due to the laser scan boundary. It also adversely affects image sensor performance by making it more difficult for the sensor array to detect light. Therefore, it is desirable to control line scan or step scan pattern during laser annealing to keep laser scan boundaries from occurring within the sensor array of an image sensor.

Figure 5:
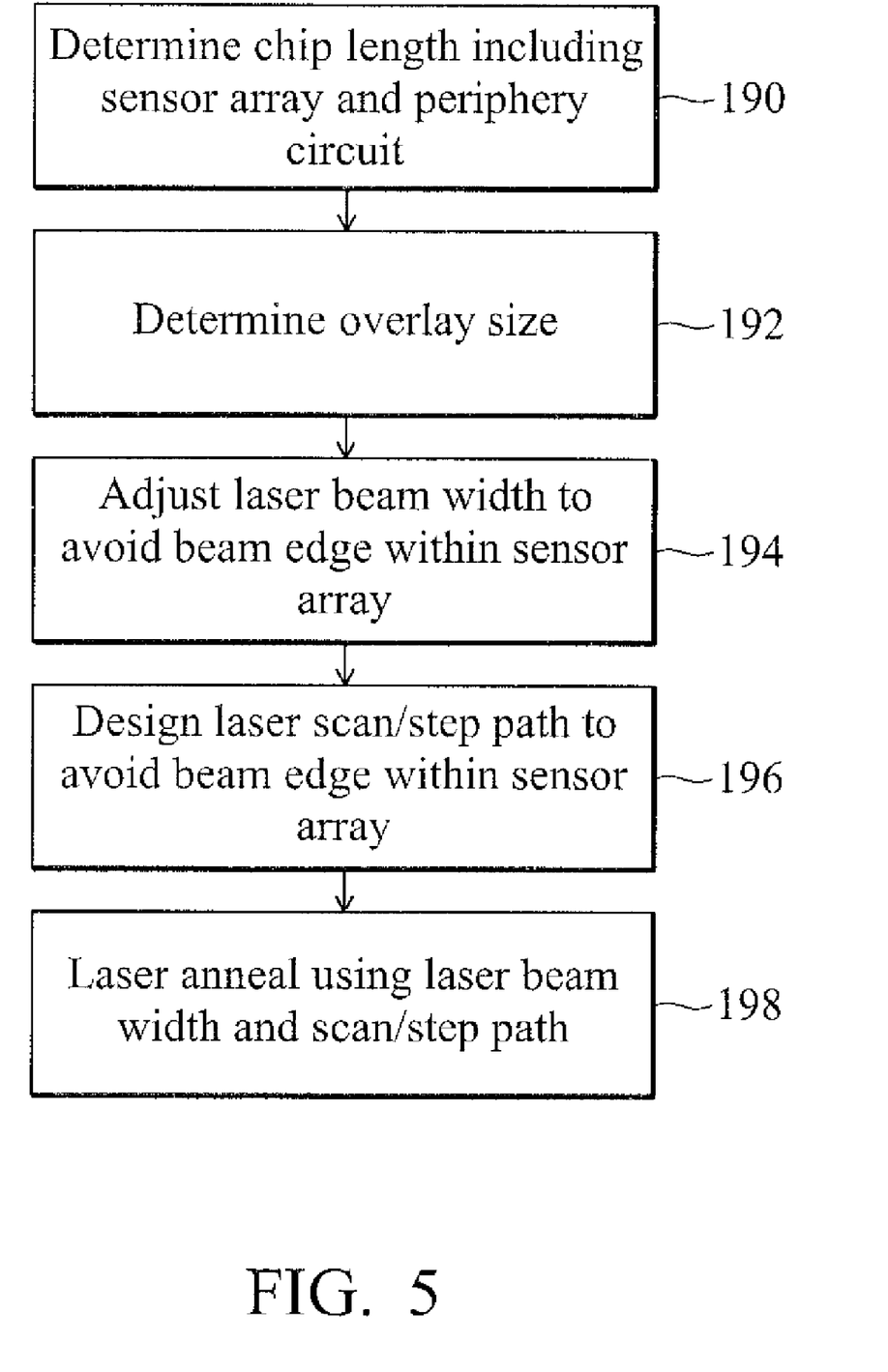
FIG. 5 shows a method for avoiding laser scan boundaries within sensor array regions of image sensors when laser annealing a wafer according to one or more embodiments of the present disclosure.

FIG. 5 shows a method for avoiding laser scan boundaries within sensor array regions of image sensors when laser annealing a wafer according to one or more embodiments of the present disclosure. The wafer may consist of an array of image sensors. Each image sensor has a sensor array region and a periphery circuit. The method determines a laser beam width and a line scan pattern as a function of the dimension of the image sensor and the desired amount of overlap between beam widths of adjacent scan lines. The method is equally applicable to step scan by determining a laser shot area and a step scan pattern as a function of the dimensions of the image sensor and the desired amount of overlap between adjacent laser shots. The result is that the laser scan boundary falls within the periphery circuit, and not within the sensor array region. Because there is no dark current produced when the laser scan boundary falls on the periphery circuit, the method maintains the performance of the image sensor.

Steps 190 determines the lengths of the image sensor, the length of the sensor array region, and the length of the periphery circuit in the direction orthogonal to the direction of the line scan. For a typical line scan along the horizontal length of the image sensor, step 190 determines the longitudinal length of the image sensor, the sensor array region, and the periphery circuit. For step scan, step 190 determines both the longitudinal and horizontal length of the image sensor, the sensor array region, and the periphery circuit.

Step 192 determines the desired amount of overlap between beam widths of adjacent scan lines for line scan. The desired overlap may be expressed as a fixed percentage or as a range of percentage of the beam width. Alternatively, the overlap may be expressed as a fixed length or as a range of length in the longitudinal direction. For step scan, step 192 may determine the desired overlap between adjacent laser shots in both the longitudinal and horizontal directions as the laser shot steps in the longitudinal and horizontal direction, respectively. Similarly, the desired overlap may be expressed as a fixed percentage or a range of percentage of the longitudinal and the horizontal length of the laser shot. Alternatively, the overlap may be expressed as a fixed length or as a range of length in both the longitudinal and the horizontal direction.

Step 194 uses the information from steps 190, 192 to adjust the laser beam width for line scan or the laser shot size for step scan so that it allows for placement of the laser scan boundary within the periphery circuits. For example, in line scan, the width of the laser beam may be a sum of the desired overlap and an integer multiple of the longitudinal length of the image sensor. This allows the laser beam to be shifted in the longitudinal direction at the end of the scan lines by the integer multiple of the longitudinal length of the image sensor so as to maintain the boundary of the laser beam within the periphery circuits. Similarly, for step scan, the horizontal and longitudinal length of the laser shot may be a sum of the overlap in the horizontal and longitudinal direction and integer multiples of the horizontal length and longitudinal length of the image sensor, respectively. The size of the laser beam or the laser shot must be capable of enveloping an integer number of the sensor array regions without enveloping part of an extra sensor array region for at least one alignment of the laser beam or laser shot with the image sensors. Once the size of laser beam width or the laser shot size is adjusted, step 196 determines the line scan or the step scan pattern on the array of image sensors to place the laser scan boundary within the periphery circuits, thus keeping the laser scan boundary outside the sensor array regions. Details of the adjustment of the laser beam width and the determination of the scan pattern will be further explained later. Finally, step 198 performs laser annealing using the adjusted laser beam width and the chosen scan pattern.

Figure 6:
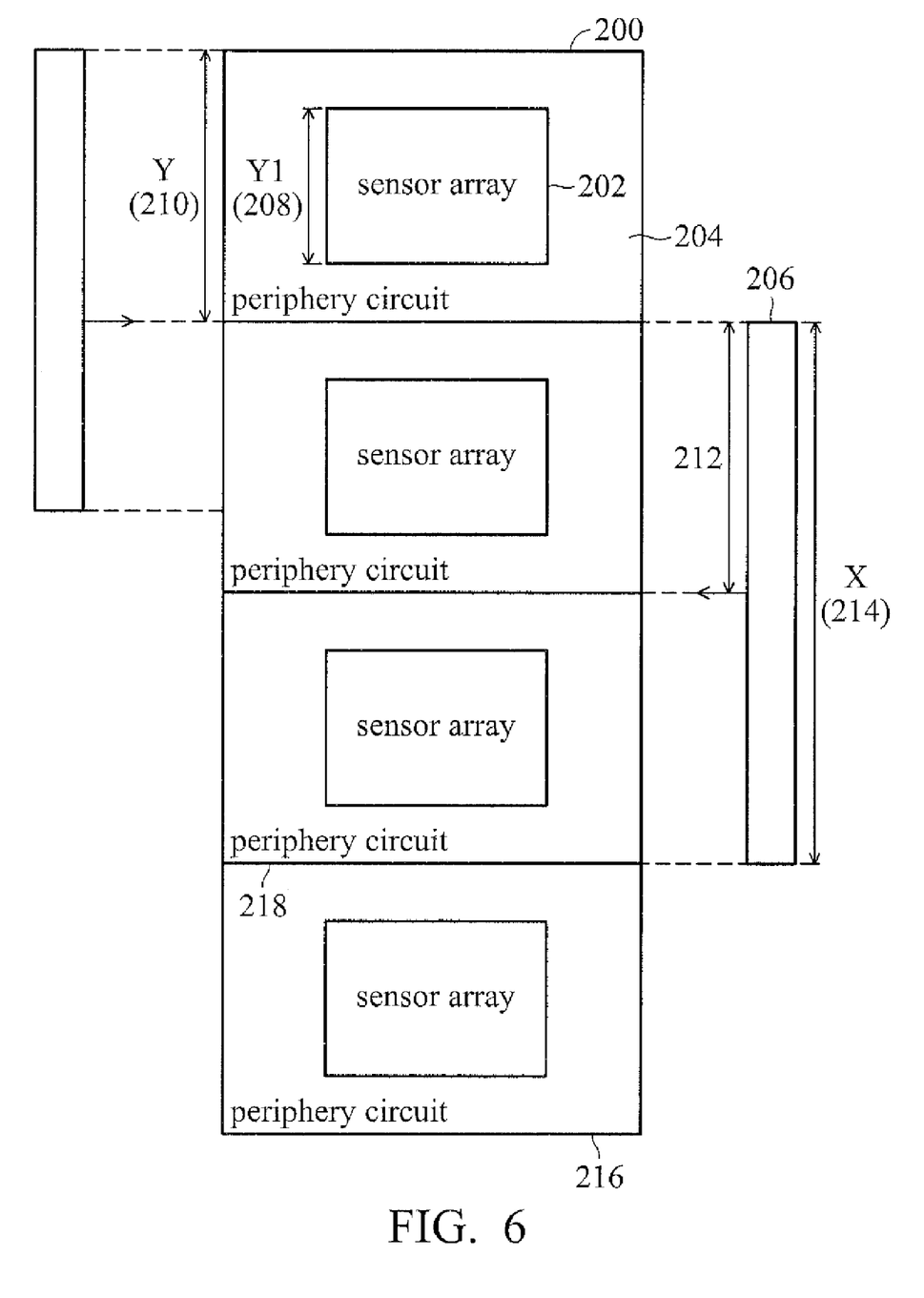
FIG. 6 shows a laser beam width and a line scan pattern for laser annealing a wafer of image sensors with a 50% overlap between beam widths of adjacent scan lines in a first exemplary application of the method of FIG. 5 according to one or more embodiments of the present disclosure.

FIG. 6 shows a laser beam width and a line scan pattern for laser annealing a wafer of image sensors with a 50% overlap between beam widths of adjacent scan lines in a first exemplary application of the method of FIG. 5 according to one or more embodiments of the present disclosure. The wafer consists of an array of BSI image sensors 200. FIG. 6 only shows one column of BSI image sensors. However, the array of BSI image sensors may extend in both the column (longitudinal) and the row (horizontal) directions. Also, in FIG. 6 each BSI image sensor 200 consists of a central sensor array region 202 surrounded by a periphery circuit 204. However, embodiments of the method of FIG. 5 are equally applicable to other arrangements of the sensor array region 202 and the periphery circuit 204 within the image sensor 200. A laser beam 206 is controlled to line scan along the horizontal direction of the array of BSI image sensors 200.

The longitudinal length $Y_1$ (208) of the sensor array region 202 and the longitudinal length Y (210) of the image sensor 200 are determined. From $Y_1$ (208) and Y (210), the longitudinal length of the periphery circuit 204 is then $(Y-Y_1)$. The desired amount of overlap 212 between beam widths of adjacent scan lines is set to 50% of the beam width X (214). Therefore, the laser beam 206 shifts up by 50% of the beam width X (214) for each new scan line. Similarly, laser scan boundaries are spaced at 50% of the beam width X (214) in the longitudinal direction. Because the image sensors are spaced apart by Y (210) and it is desirable to place the laser scan boundary within the periphery circuit 204 for every scan line, the laser scan boundaries may be spaced by any integer multiple of Y (210). Accordingly, the relationship between the laser beam width X (214) and Y (210) may be expressed as:

$$X=2nY \quad \text{[Eq. 1]}$$

where n is any positive non-zero integer.

FIG. 6 shows an example where n=1 so that the laser beam width X (214) is twice the longitudinal length Y (210) of the image sensor 200. Laser scan boundaries are then spaced apart by Y (210), or 50% of X (214). Because laser scan boundaries are spaced apart by the longitudinal length of the image sensors 200, laser scan boundaries may be placed within the periphery circuit 204 for each new scan line. The amount of overlap between beam widths of adjacent scan lines is 50% of the beam width 214, as shown by 212. FIG. 6 shows a line scan pattern where the bottom of the laser beam width X (214) is aligned with an outer edge 216 of a first periphery circuit. When the laser beam 206 shifts up by 50% of X (214), the laser beam 206 maintains the same relative position between the bottom of the laser beam width X (214) and an outer edge 218 of a second periphery circuit. Therefore, laser scan boundaries always fall within the periphery circuit 204, and not within the sensor array region 202.

Figure 7:
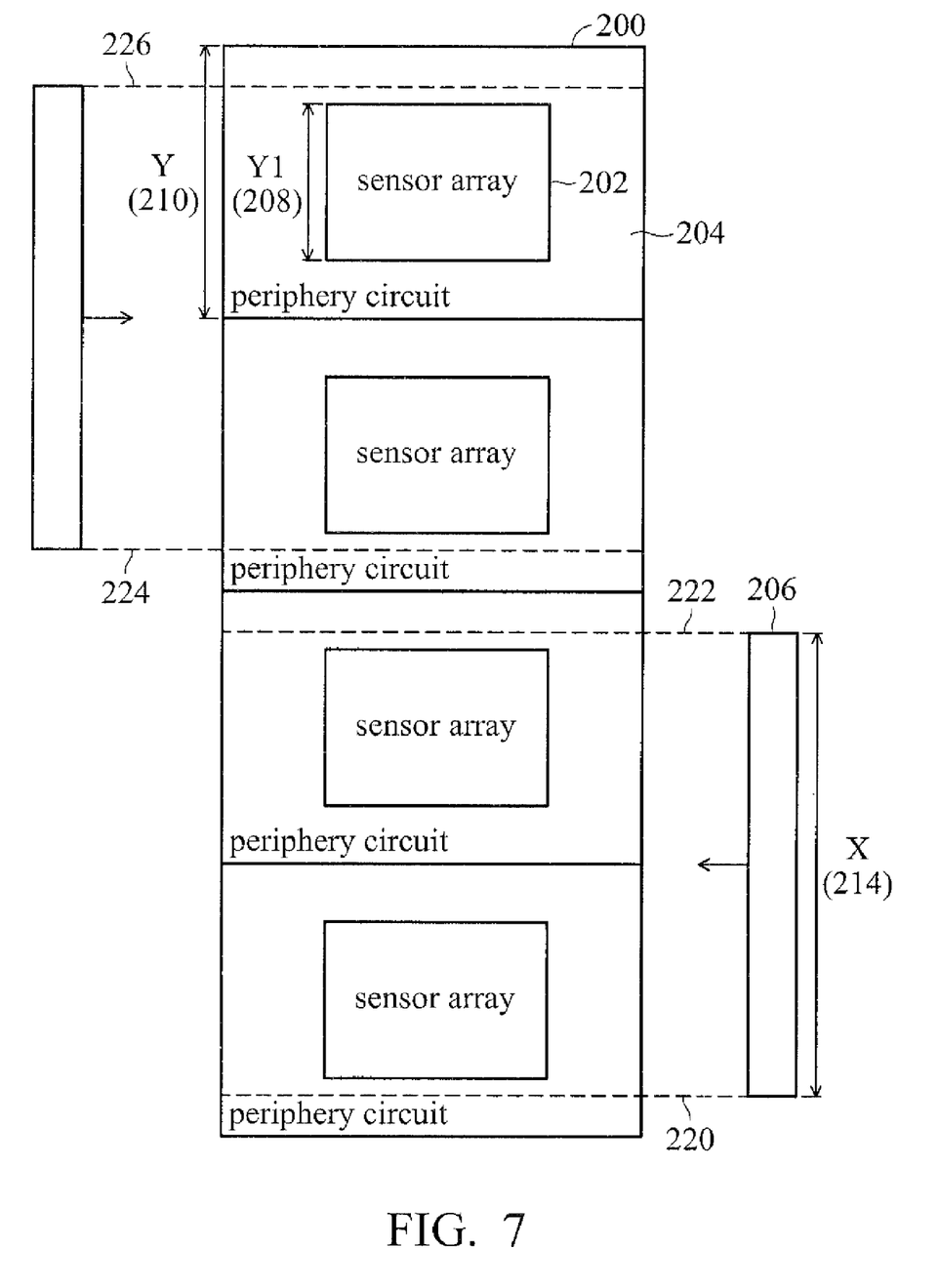
FIG. 7 shows a laser beam width and a line scan pattern for laser annealing a wafer of image sensors with no overlap between beam widths of adjacent scan lines in a second exemplary application of the method of FIG. 5 according to one or more embodiments of the present disclosure.

FIG. 7 shows a laser beam width and a line scan pattern for laser annealing a wafer of image sensors with no overlap between beam widths of adjacent scan lines in a second exemplary application of the method of FIG. 5 according to one or more embodiments of the present disclosure. As before, the longitudinal length $Y_1$ (208) of the sensor array region 202, the longitudinal length Y (210) of the image sensor 200, and the longitudinal length $(Y-Y_1)$ of the periphery circuit 204 are determined. However, in FIG. 7, there is no overlap between beam widths of adjacent scan lines. As such, the top and bottom of the laser beam 206 define the laser scan boundaries. For the laser scan boundaries to fall in the periphery circuit 204, the laser beam width X (214) has to be large enough to envelope an integer number of the sensor array regions 202. Accordingly, the relationship between the laser beam width X (214), $Y_1$ (208), and Y (210) may be expressed as:

$$nY-(Y-Y_1)<X \quad \text{[Eq. 2]}$$

where n is a positive non-zero integer that represents the number of sensor array regions 202 enveloped within the laser beam width X (214). For n=1, Eq. 2 simply requires that X (214) has to be larger than the longitudinal length $Y_1$ (208) of one sensor array region 202.

FIG. 7 shows an example of Eq. 2 for n=2 so that the laser beam width X (214) envelopes two sensor array regions 202. FIG. 7 also shows a first scan line where the bottom and top of the laser beam width X (214) is aligned just outside two adjacent sensor array regions 202 along laser scan boundaries 220 and 222, respectively. The laser beam 206 then shifts up by a longitudinal distance of 2Y for the next scan line with no overlap between beam widths of adjacent scan lines. After the shift, the laser beam 206 maintains the same relative position between the position of the laser beam width X (214) and the sensor array regions 202 of the next two image sensors 200. That is, the bottom and top of the laser beam width X (214) is still aligned just outside two adjacent sensor array regions 202 along laser scan boundaries 224 and 226, respectively. Therefore, laser scan boundaries always fall within the periphery circuit 204.

Figure 8:
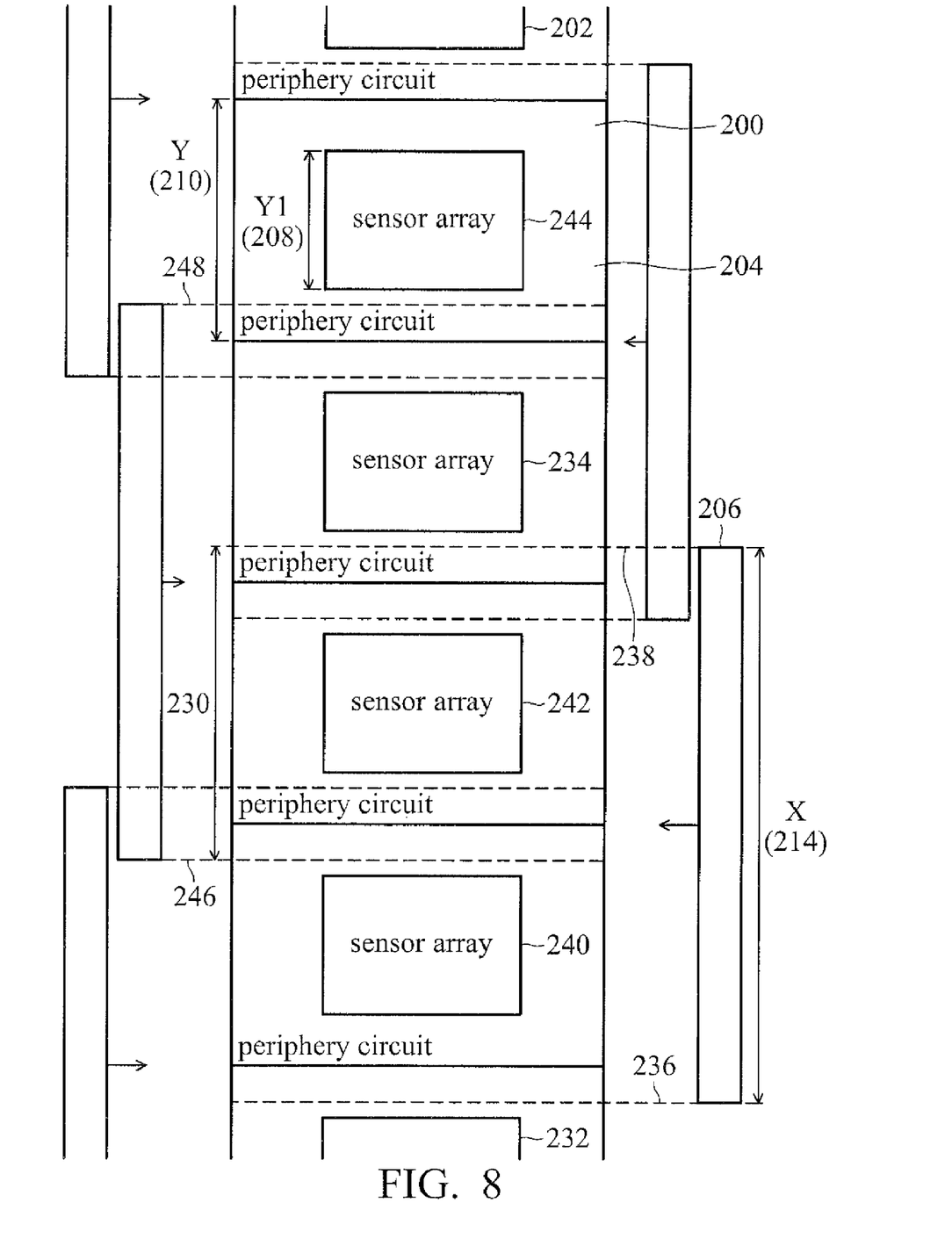
FIG. 8 shows a laser beam width and a line scan pattern for laser annealing a wafer of image sensors with more than 50% overlap between beam widths of adjacent scan lines in a third exemplary application of the method of FIG. 5 according to one or more embodiments of the present disclosure.

FIG. 8 shows a laser beam width and a line scan pattern for laser annealing a wafer of image sensors with more than 50% overlap between beam widths of adjacent scan lines in a third exemplary application of the method of FIG. 5 according to one or more embodiments of the present disclosure. As before, the longitudinal length $Y_1$ (208) of the sensor array region 202, the longitudinal length Y (210) of the image sensor 200, and the longitudinal length $(Y-Y_1)$ of the periphery circuit 204 are determined. The desired amount of overlap 230 between beam widths of adjacent scan lines is more than 50% of the beam width X (214). Therefore, the laser beam 206 shifts up by less than 50% of the beam width X (214) for each new scan line. Typically, the laser beam 206 shifts by an integer multiple of the longitudinal length Y (210) of the image sensors 200 to maintain the same relative position between the laser beam width X (214) and the sensor array regions (202).

For the laser scan boundaries to fall in the periphery circuit (204), the laser, beam width X (214) has to be large enough to envelope an integer number of the sensor array regions (202) but not too large that it envelopes part of an extra sensor array region (202). Accordingly, the relationship between the laser beam width X (214) $Y_1$ (208), and Y (210) may be expressed as:

$$X<nY+(Y-Y_1) \quad \text{[Eq. 3]}$$

where n is a positive non-zero integer that represents the number of sensor array regions (202) enveloped within the laser beam width X (214).

FIG. 8 shows an example of Eq. 3 for n=2 so that the laser beam width X (214) is large enough to envelope two sensor array regions (202) but is not too large to envelope part of a third sensor array region (202). FIG. 8 also shows a first scan line where the bottom and top of the laser beam width X (214) is aligned just outside sensor arrays 232 and 234 along laser scan boundaries 236 and 238, respectively. The laser beam width X (214) for this first scan line envelopes sensor arrays 240 and 242. The laser beam 206 then shifts up by Y (210) for the next scan line to achieve the overlap 230 that is more than 50% between beam widths of adjacent scan lines. After the shift, the bottom and top of the laser beam width X (214) is aligned just outside sensor arrays 240 and 244 along laser scan boundaries 246 and 248, respectively. The laser beam width X (214) for this second scan line envelopes sensor arrays 242 and 234. Therefore, laser scan boundaries always fall within the periphery circuit 204.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

We claim:

1. A method of laser annealing a wafer having a plurality of dies with a laser beam, the method comprising:
   receiving a first length of a first sub-area within one of the dies wherein the first sub-area is not allowed to overlap with a boundary of the laser beam;
   receiving a second length of a second sub-area within one of the dies wherein the second sub-area is permitted to overlap with the boundary of the laser beam;
   receiving a desired overlap between adjacent scan paths of a scan pattern;
   determining a size of the laser beam from the first length, the second length, and the desired overlap so that the size of the laser beam is large enough to cover an integer number of the first sub-area without partially covering an additional first sub-area;
   determining a scan pattern for the laser beam so that the boundary of the laser beam of the determined size does not overlap the first sub-area throughout the scan pattern; and
   laser annealing the wafer based on the determined size of the laser beam and the determined scan pattern for the laser beam.

2. The method of claim 1, wherein the plurality of dies is a plurality of image sensors, the first sub-area is a sensor array region, and the second sub-area is a periphery circuit.

3. The method of claim 1, wherein the scan pattern is a line scan having a plurality of scan lines, the size of the laser beam is a width of the laser beam, the scan paths are the scan lines, and the desired overlap is an overlap of the widths of the laser beam between adjacent scan lines of the line scan.

4. The method of claim 3, wherein the first length and the second length are orthogonal to a direction of the scan lines.

5. The method of claim 3, wherein the width of the laser beam is a sum of the desired overlap and an integer multiple of a sum of the first length and the second length.

6. The method of claim 3, wherein if the desired overlap is 50% of the width of the laser beam, the width of the laser beam is twice an integer multiple of a sum of the first length and the second length.

7. The method of claim 6, wherein said determining the scan pattern comprises:
   positioning the laser beam so that the boundary of the laser beam for the plurality of scan lines overlaps only the second sub-area; and
   shifting the laser beam at the end of each of the plurality of scan lines by an amount equal to 50% of the width of the laser beam.

8. The method of claim 3, wherein the width of the laser beam is more than a minimum length and less than a maximum length, wherein the minimum length is obtained from taking a first integer multiple of a sum of the first length and the second length to generate a multiplier result, and subtracting from the multiplier result the second length, and wherein the maximum length is a sum of the multiplier result and the second length.

9. The method of claim 8, wherein said determining the scan pattern comprises:
   positioning the laser beam so that the boundary of the laser beam for the plurality of scan lines overlaps only the second sub-area; and
   shifting the laser beam at the end of each of the plurality of scan lines by a shift amount equal to a second integer multiple of a sum of the first length and the second length, wherein the second integer multiple is not greater than the first integer multiple, and the desired overlap is a difference between the width of the laser beam and the shift amount.

10. The method of claim 3, wherein the width of the laser beam is shifted at the end of each of the plurality of scan lines by an amount equal to the width of the laser beam minus the overlap of the widths of the laser beam between adjacent scan lines of the line scan.

11. The method of claim 1, wherein the scan pattern is a step scan having a plurality of laser shots, the size of the laser beam is an area of the laser shot comprising a width and a length of the laser shot, the scan paths are the laser shots, and the desired overlap comprises a width of the overlap which is equal to an overlap of the areas between adjacent laser shots in a width direction, and a length of the overlap which is equal to an overlap of the areas between adjacent laser shots in a length direction.

12. The method of claim 11, wherein the first length and the second length are in the length direction and the method further comprises:
   receiving a first width of the first sub-area within one of the dies wherein the first width is in the width direction; and
   receiving a second width of the second sub-area within one of the dies wherein the second width is in the width direction.

13. The method of claim 12, wherein the width of the laser shot is a sum of the width of the overlap and an integer multiple of a sum of the first width and the second width.

14. The method of claim 12, wherein the width of the laser shot is more than a minimum width and less than a maximum width, wherein the minimum width is obtained from taking a first integer multiple of a sum of the first width and the second width to generate a multiplier result, and subtracting from the multiplier result the second width, and wherein the maximum width is a sum of the multiplier result and the second width.

15. The method of claim 14, wherein said determining the scan pattern comprises:
   positioning the laser shot so that the boundary of the laser shot overlaps only the second sub-area; and
   shifting the laser shot by a shift amount equal to a second integer multiple of a sum of the first length and the second length, wherein the second integer multiple is not greater than the first integer multiple, and the width of the overlap is a difference between the width of the laser shot and the shift amount.

16. The method of claim 12, wherein the length of the laser shot is a sum of the length of the overlap and an integer multiple of a sum of the first length and the second length.

17. The method of claim 12, wherein the length of the laser shot is more than a minimum length and less than a maximum length, wherein the minimum length is obtained from taking a first integer multiple of a sum of the first length and the second length to generate a multiplier result, and subtracting from the multiplier result the second length, and wherein the maximum length is a sum of the multiplier result and the second length.

18. The method of claim 17, wherein said determining the scan pattern comprises:
   positioning the laser shot so that the boundary of the laser shot overlaps only the second sub-area; and shifting the laser shot by a shift amount equal to a second integer multiple of a sum of the first length and the second length, wherein the second integer multiple is not greater than the first integer multiple, and the length of the overlap is a difference between the length of the laser shot and the shift amount.

19. A method of laser annealing an array of backside illuminated (BSI) image sensors having a sensor array region and a periphery circuit with a laser beam in a scan pattern having a plurality of scan paths comprising:
   determining a size of the laser beam from a length of the sensor array region and a length of the periphery circuit so that the laser beam covers an integer number of the sensor array region for at least one scan path of the laser beam on the array of BSI image sensors;
   aligning the laser beam on the array of BSI image sensors so that a boundary of the laser beam does not overlap a sensor array region;
   laser annealing the array of BSI image sensors following a first scan path;
   shifting the laser beam by an integer number of a length of one of the array of BSI image sensors; and
   repeating said laser annealing the array of BSI image sensors and said shifting the laser beam until the array of BSI image sensors is laser annealed.

20. A method of laser annealing an array of backside illuminated (BSI) image sensors on a wafer with a laser beam, wherein each BSI imager sensor has a sensor array and a periphery circuit, the method comprising:
   determining a size of the sensor array and a size of the periphery circuit for each BSI image sensor;
   determining a size of the laser beam relative to the size of the sensor array and the size of the periphery circuit for each BSI imager sensor;
   modifying the size of the laser beam such that an outer edge boundary of the modified laser beam fails to overlap any of the sensory arrays of the BSI image sensors during a scan pattern using the modified size of the laser beam; and
   laser annealing the wafer based on the modified size of the laser beam and the scan pattern for the laser beam.

* * * * *